United States Patent
Lee

(10) Patent No.: US 7,379,369 B2
(45) Date of Patent: May 27, 2008

(54) SEMICONDUCTOR DEVICE

(75) Inventor: Jong Won Lee, Icheon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 149 days.

(21) Appl. No.: 11/461,615

(22) Filed: Aug. 1, 2006

(65) Prior Publication Data
US 2007/0147154 A1    Jun. 28, 2007

(30) Foreign Application Priority Data
Dec. 28, 2005  (KR) .................. 10-2005-0132468

(51) Int. Cl.
*G11C 7/00*      (2006.01)
(52) U.S. Cl. .................... 365/222; 365/225.7
(58) Field of Classification Search ................ 365/222, 365/225.7, 230.06
See application file for complete search history.

(56) References Cited

U.S. PATENT DOCUMENTS

| | | | |
|---|---|---|---|
| 6,366,515 B2 * | 4/2002 | Hidaka ........................ | 365/200 |
| 6,611,470 B2 * | 8/2003 | Hidaka ........................ | 365/222 |
| 6,947,345 B2 | 9/2005 | Takahashi et al. | |
| 2004/0209431 A1 | 10/2004 | Oyu et al. | |

FOREIGN PATENT DOCUMENTS

| | | |
|---|---|---|
| JP | 2-260195 | 10/1990 |
| JP | 11-126476 | 5/1999 |
| JP | 2002-170387 | 6/2002 |
| KR | 10-1999-0075976 | 10/1999 |
| KR | 10-1999-0085081 | 12/1999 |
| KR | 10-2005-0095980 A | 10/2005 |

* cited by examiner

*Primary Examiner*—Vu A. Le
(74) *Attorney, Agent, or Firm*—Marshall, Gerstein & Borun LLP

(57) ABSTRACT

A multi-word line refresh-type semiconductor device may have a plurality of memory banks and performs a refresh operation simultaneously with respect to a plurality of word lines for each of the banks in a self-refresh mode. The semiconductor device includes an address controller for receiving a normal address and a refresh address and selectively outputting the received refresh address in a refresh mode, a fuse circuit for receiving the refresh address, determining whether the received refresh address corresponds to a word line to be repaired and outputting a redundancy word line enable signal and a first control signal according to a result of the determination, a first signal generator for, in response to a bit value for block selection of the refresh address and the first control signal, outputting a second control signal which defines a multi-word line refresh period, a refresh address generator for generating the refresh address in response to the second control signal, and a row controller for receiving the refresh address, second control signal and redundancy word line enable signal and controlling the refresh operation with respect to a memory core.

61 Claims, 9 Drawing Sheets

SEMICONDUCTOR DEVICE

BACKGROUND

1. Technical Field

This patent relates to a semiconductor device, and more particularly to a multi-word line refresh-type semiconductor device for performing a refresh operation simultaneously with respect to a plurality of word lines for each bank in a self-refresh mode.

2. Description of the Related Art

With the advance of wireless communications and the development of various contents, a matter of reduction in power consumption of mobile products has become a very important issue. In this regard, a matter of reduction in refresh current has become one important issue in dynamic random access memories (DRAMs). The refresh operation of a semiconductor device, such as a DRAM, is classified into an auto-refresh type and a self-refresh type. In the refresh operation, the semiconductor device refreshes each word line of a memory core at a certain period appropriate to a refresh retention time of each cell in the memory core according to a given operation type.

A self-refresh mode is an operation mode where, when a system including the DRAM is not operated for a certain time, the DRAM performs the refresh operation by itself for retention of information stored therein. It is therefore preferable that a smaller amount of current is consumed in the self-refresh mode.

Conventionally, the refresh operation is performed with respect to one word line for each bank in the DRAM in the self-refresh mode. Accordingly, whenever the refresh operation is performed, a series of control circuits are operated to activate a corresponding word line and a sense amplifier which drives that word line. For this reason, assuming that 8×1024 word lines are present in each bank, the series of control circuits must be operated 8×1024 times to refresh data in cells connected to all those word lines, resulting in a large amount of operating current being consumed.

In order to solve the above problem, a multi-word line refresh-type semiconductor device has been proposed in which an increased number of word lines, namely, two or more word lines, not one word line, are activated in one refresh operation. That is, in one refresh operation, at least two word lines are refreshed for each bank. As a result, in the proposed semiconductor device, the refresh rate is increased to at least twice that in the above-mentioned method. However, this multi-word line refresh-type semiconductor device has a problem as will be described below.

FIG. 1 is a block diagram showing the configuration of a conventional multi-word line refresh-type semiconductor device, which is an exemplary semiconductor device for performing a refresh operation simultaneously with respect to two word lines for each bank in a self-refresh mode.

As shown in FIG. 1, in the conventional semiconductor device, one bank is partitioned into an upper block and a lower block, and a row controller 121 and a row controller 122 are separately installed to control the refresh operation with respect to the upper block and lower block, respectively. An upper fuse circuit 111 and a lower fuse circuit 112 are separately installed to receive a refresh address xadd, determine whether the received refresh address xadd corresponds to a word line to be repaired (i.e., a failed word line to be replaced with a redundancy word line), and output a redundancy word line enable signal red_en_h and a redundancy word line enable signal red_en_l according to a result of the determination, respectively.

In the conventional semiconductor device, as shown in FIG. 1, in the self-refresh mode, two word lines whose bit values of the refresh address xadd, except a bit value for block selection (for example, a most significant bit (MSB) value), are the same are selected one by one respectively in the upper block 131 and lower block 132, and the refresh operation is performed simultaneously with respect to the selected two word lines. For example, the refresh operation is performed simultaneously with respect to a word line SWL00_h and a word line SWL00_l. This refresh operation is performed sequentially with respect to up to a word line SWLx_h and a word line SWLx_l. On the other hand, in the case where the refresh address xadd corresponds to a word line to be repaired which is a failed word line to be replaced with a redundancy word line, the upper fuse circuit 111 or lower fuse circuit 112 determines the refresh address xadd to correspond to the word line to be repaired, and then outputs the control signal red_en_h or control signal red_en_l to replace the word line to be repaired with the redundancy word line. Then, the row controller 121 or row controller 122 performs the refresh operation with respect to the redundancy word line in response to the control signal red_en_h or control signal red_en_l. As a result, in this case, redundancy word lines installed respectively in the upper block and lower block in one bank are used for only the corresponding blocks. In other words, the conventional dual word line refresh scheme requires redundancy word lines which are twice as many as those in a single word line refresh scheme which performs the refresh operation with respect to only one word line. For this reason, the conventional semiconductor device has a disadvantage in that the number of redundancy word lines is increased, resulting in an increase in chip area. It is also disadvantageous in that repair efficiency of each redundancy word line is reduced.

SUMMARY OF THE INVENTION

A multi-word line refresh-type semiconductor device performs a refresh operation simultaneously with respect to a plurality of word lines for each bank in a self-refresh mode, wherein redundancy word lines to replace word lines to be repaired are not installed separately in a plurality of blocks in each bank, but shared by the blocks, so that a chip area occupied by the redundancy word lines can be reduced, thereby securing economic efficiency of chip design and increasing repair efficiency of the redundancy word lines for failed word lines.

A multi-word line refresh-type semiconductor device has a plurality of memory banks and performs a refresh operation simultaneously with respect to a plurality of word lines for each of the banks in a self-refresh mode, the semiconductor device may include: an address controller for receiving a normal address and a refresh address and selectively outputting the received refresh address in a refresh mode; a fuse circuit for receiving the refresh address, determining whether the received refresh address corresponds to a word line to be repaired and outputting a redundancy word line enable signal and a first control signal according to a result of the determination; a first signal generator for, in response to a bit value for block selection of the refresh address and the first control signal, outputting a second control signal which defines a multi-word line refresh period; a refresh address generator for generating the refresh address in response to the second control signal; and a row controller for receiving the refresh address, second control signal and redundancy word line enable signal and controlling the refresh operation with respect to a memory core, wherein the semiconductor device performs, in the self-refresh mode, multi-word line refreshing when the refresh address corresponds to a normal word line and single word line refreshing for a certain period when the refresh address corresponds to the word line to be repaired.

The fuse circuit may include a plurality of fuse sets, each of the fuse sets including a plurality of fuses whose cutting is determined depending on the word line to be repaired, and acting to output a plurality of determination signals in response to the refresh address; a decoder for decoding the determination signals to output the redundancy word line enable signal; and a second signal generator for outputting the first control signal in response to the determination signals.

The second signal generator may enable the first control signal when all the determination signals from at least one of the fuse sets are enabled in the self-refresh mode.

The second signal generator may include a plurality of first logic devices, each of the first logic devices performing an AND operation with respect to the determination signals from a corresponding one of the fuse sets; a second logic device for performing an OR operation with respect to output signals from the first logic devices; and a third logic device for performing the AND operation with respect to an output signal from the second logic device and a self-refresh signal.

The first signal generator may include a first signal processor for outputting a first signal which is enabled for a predetermined period, in response to an enabled state of a self-refresh signal; a second signal processor for outputting a second signal which is enabled for the predetermined period, in response to a disabled state of the block selection bit value; a third signal processor for outputting a third signal which is enabled for the predetermined period, in response to an enabled state of the first control signal; a first logic circuit for performing a logic operation with respect to the first signal from the first signal processor and the second signal from the second signal processor; and a latch for latching an output signal from the first logic circuit and the third signal from the third signal processor.

The first signal processor may include a delay for delaying and inverting the self-refresh signal by the predetermined period; and a second logic circuit for performing a logic operation with respect to the self-refresh signal and an output signal from the delay.

The second signal processor may include a delay for delaying and inverting the block selection bit value by the predetermined period; and a second logic circuit for performing a logic operation with respect to the block selection bit value and an output signal from the delay.

The third signal processor may include a delay for delaying and inverting the first control signal by the predetermined period; and a second logic circuit for performing a logic operation with respect to the first control signal and an output signal from the delay.

The latch may include a first logic gate for receiving the output signal from the first logic circuit at its one input terminal; and a second logic gate for receiving the third signal from the third signal processor at its one input terminal, wherein the first logic gate and the second logic gate are interconnected in latch form and each perform a NOR operation.

The first signal generator may further include a second logic circuit for performing a logic operation with respect to a buffered version of the self-refresh signal and an output signal from the latch.

The refresh address generator may include a first counter for receiving a refresh enable pulse which is enabled at a certain period and the second control signal and counting the refresh enable pulse in response to a disabled state of the second control signal to output the block selection bit value; a second counter for receiving the refresh enable pulse, second control signal and block selection bit value and outputting a first bit value of the refresh address in response to the second control signal; and a third counter for counting the first refresh address bit value to output a second bit value of the refresh address.

The first counter may include a first buffer for buffering the second control signal; a logic circuit for performing a logic operation with respect to an output signal from the first buffer and the refresh enable pulse; a counting circuit for counting an output signal from the logic circuit to output the block selection bit value; and enabling means for enabling the counting circuit in response to the second control signal.

The enabling means may include voltage holding means for holding a voltage at a specific node of the counting circuit in response to the second control signal.

The counting circuit may include a second buffer for buffering the output signal from the logic circuit; a first tri-state buffer for buffering a signal at the specific node in response to the output signal from the logic circuit; a first latch for latching an output signal from the first tri-state buffer in response to the output signal from the logic circuit; a second tri-state buffer for buffering an output signal from the first latch in response to the output signal from the logic circuit; a second latch for latching an output signal from the second tri-state buffer in response to the output signal from the logic circuit; a third buffer for buffering an output signal from the second latch; and a fourth buffer for buffering the output signal from the first tri-state buffer to output the block selection bit value.

The second counter may generate the first refresh address bit value by counting the refresh enable pulse when the second control signal is in its enabled state and by counting the block selection bit value when the second control signal is in its disabled state.

The second counter may include a first transfer gate for transferring the refresh enable pulse to a specific node in response to the second control signal; a second transfer gate for transferring the block selection bit value to the specific node in response to the second control signal; and a counting circuit for counting a signal at the specific node to output the first refresh address bit value.

The row controller may simultaneously enable a first block select signal and a second block select signal when a self-refresh signal and the second control signal are enabled, and selectively enable any one of the first block select signal and second block select signal in response to the block selection bit value when the second control signal is disabled.

The row controller may include a block selector, the block selector including: a first logic circuit for performing a logic operation with respect to the self-refresh signal and the second control signal; a second logic circuit for performing a logic operation with respect to an output signal from the first logic circuit and the block selection bit value; a buffer for buffering the output signal from the first logic circuit; and a third logic circuit for performing a logic operation with respect to an output signal from the buffer and the block selection bit value.

The semiconductor device may further include an address latch circuit for latching the refresh address outputted from the address controller and providing the latched refresh address to the fuse circuit and row controller.

The address latch circuit may include a latch enable signal generator for generating a first latch enable signal and a second latch enable signal in response to a first active signal and a second active signal; and a plurality of sub-latch circuits for latching the refresh address in response to the first and second latch enable signals.

The latch enable signal generator may include a latch for latching the first active signal and the second active signal; a buffer for buffering an output signal from the latch; and a delay for delaying an output signal from the buffer and outputting the delayed signal as the first latch enable signal.

The latch may include a first NOR gate for receiving the first active signal at its one input terminal; and a second NOR gate for receiving the second active signal at its one input terminal, wherein the first NOR gate and the second NOR gate are interconnected in latch form.

Each of the sub-latch circuits may include a first buffer for buffering the second latch enable signal; a first logic circuit for performing a logic operation with respect to an output signal from the first buffer and a self-refresh signal; a tri-state buffer for buffering a corresponding bit value of the refresh address in response to the first latch enable signal; a latch for latching an output signal from the tri-state buffer in response to the first latch enable signal; and a second logic circuit for performing a logic operation with respect to the output signal from the tri-state buffer and an output signal from the first logic circuit.

The first active signal may be an active enable signal and the second active signal may be a precharge enable signal.

The block selection bit value may be a most significant bit value of the refresh address.

BRIEF DESCRIPTION OF THE DRAWINGS

Various features and advantages of the present invention will be more clearly understood from the following detailed description taken in conjunction with the accompanying drawings, in which.

DETAILED DESCRIPTION

Figure 1:
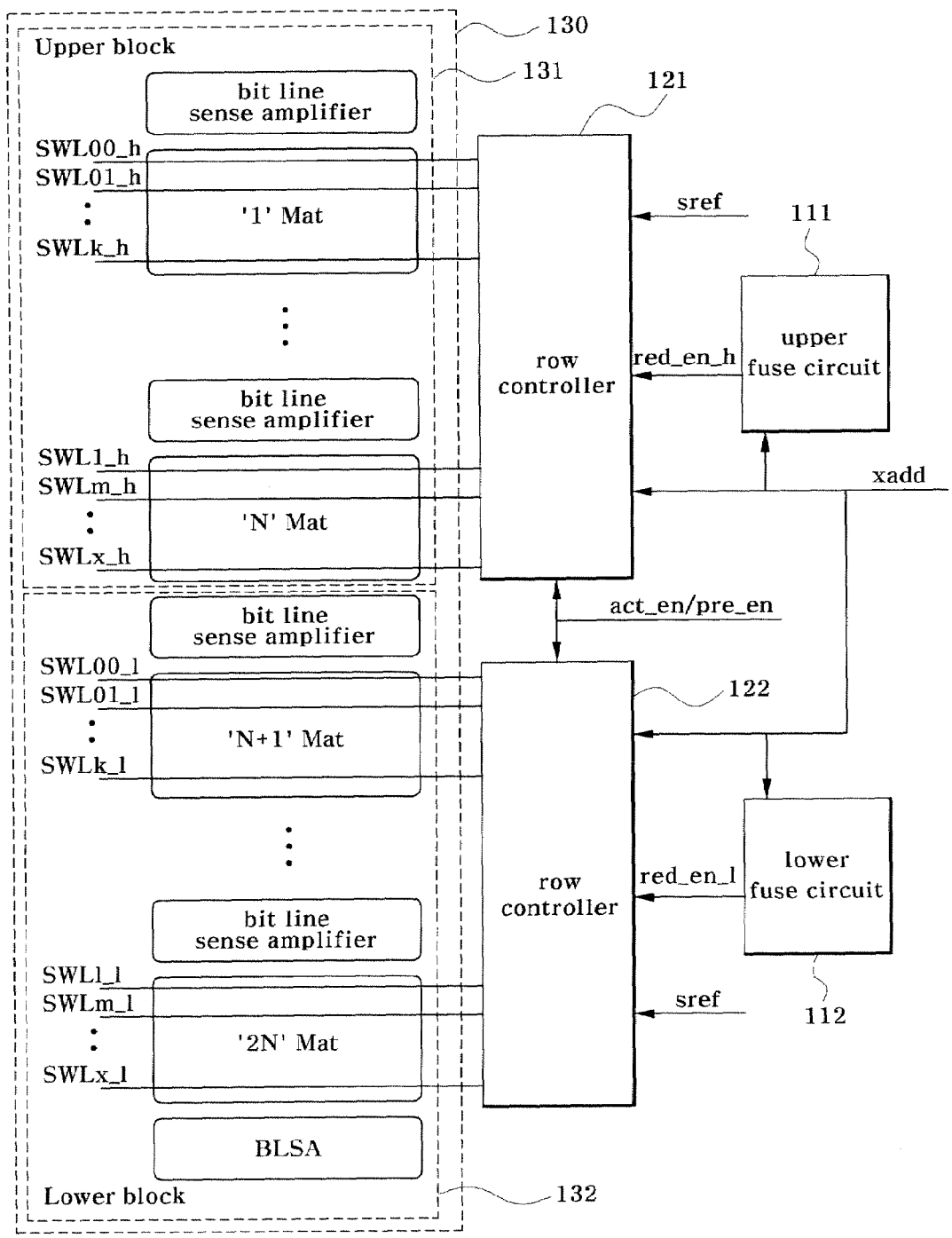
FIG. 1 is a block diagram showing the configuration of a conventional semiconductor device.

Reference will now be made in detail to various embodiments of the present invention, examples of which are illustrated in the accompanying drawings, wherein like reference numerals refer to like elements throughout. The embodiments are described below to explain the present invention by referring to the figures.

Figure 2:
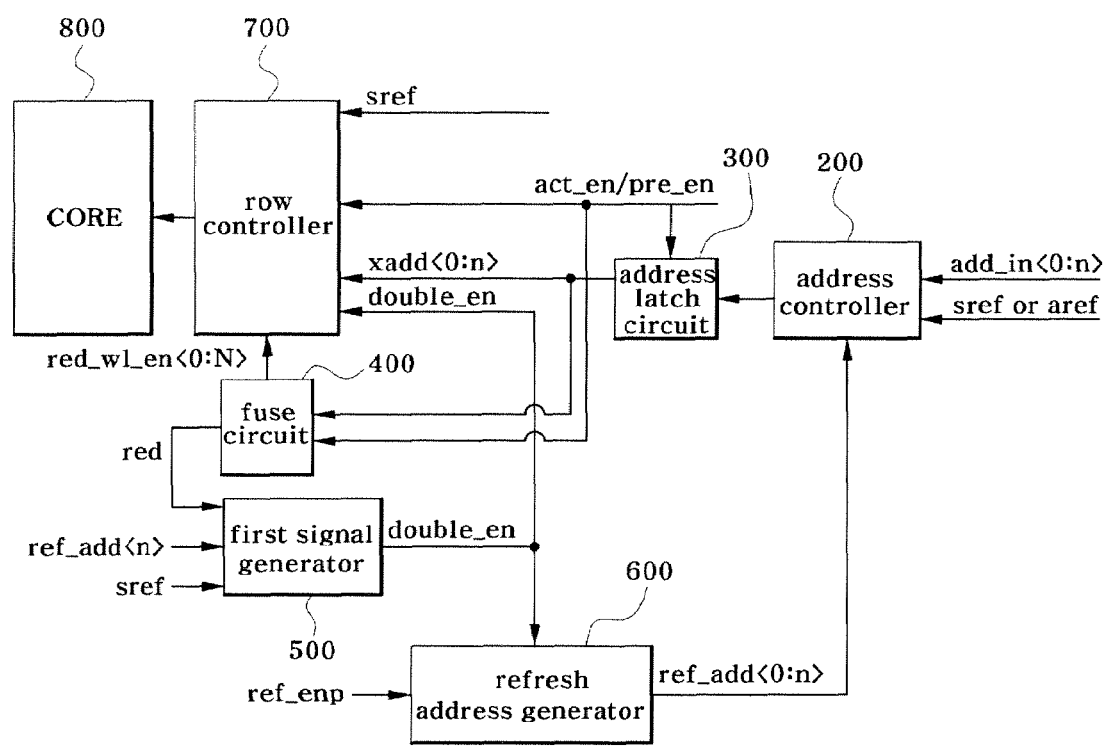
FIG. 2 is a block diagram showing the configuration of a semiconductor device according to an exemplary embodiment.

FIG. 2 is a block diagram showing the configuration of a semiconductor device according to an exemplary embodiment. The configuration of the semiconductor device according to this embodiment will hereinafter be described with reference to FIG. 2.

The semiconductor device according to the present embodiment is a multi-word line refresh-type semiconductor device which has a plurality of memory banks and performs a refresh operation simultaneously with respect to a plurality of word lines for each of the banks in a self-refresh mode. As shown in FIG. 2, the semiconductor device according to the present embodiment comprises an address controller 200 for receiving a normal address add_in<0:n> and a refresh address ref_add<0:n> and selectively outputting the received refresh address ref_add<0:n> in a refresh mode, an address latch circuit 300 for latching the refresh address ref_add<0:n> outputted from the address controller 200 to output a latched refresh address xadd<0:n>, a fuse circuit 400 for receiving the latched refresh address xadd<0:n>, determining whether the received refresh address xadd<0:n> corresponds to a word line to be repaired and outputting a redundancy word line enable signal red_wl_en<0:N> and a first control signal red according to a result of the determination, a first signal generator 500 for, in response to a bit value for block selection of the refresh address ref_add<0:n> and the first control signal red, outputting a second control signal double_en which defines a multi-word line refresh period, a refresh address generator 600 for generating the refresh address ref_add<0:n> in response to the second control signal double_en, and a row controller 700 for receiving the latched refresh address xadd<0:n>, second control signal double_en and redundancy word line enable signal red_wl_en<0:N> and controlling the refresh operation with respect to a memory core 800. The semiconductor device according to the present embodiment performs, in the self-refresh mode, multi-word line refreshing when the refresh address xadd<0:n> corresponds to a normal word line and single word line refreshing for a certain period when the refresh address xadd<0:n> corresponds to a word line to be repaired.

The operation of the semiconductor device with the above-stated configuration according to this embodiment will hereinafter be described in detail with reference to FIGS. 2 to 7.

First, as shown in FIG. 2, the address controller 200 receives the normal address add_in<0:n> and the refresh address ref_add<0:n> and selectively outputs the received normal address add_in<0:n> or refresh address ref_add<0:n> in response to a self-refresh signal sref or auto-refresh signal aref. The self-refresh signal sref is enabled in the self-refresh mode and the auto-refresh signal aref is enabled in an auto-refresh mode. The address controller 200 of the present embodiment is the same in configuration as those widely used in conventional semiconductor devices, and is operated as hereinafter described in detail. The address controller 200 selectively outputs the normal address add_in<0:n> when the self-refresh signal sref and auto-refresh signal aref are disabled, and the refresh address ref_add<0:n> when the self-refresh signal sref or auto-refresh signal aref is enabled. A description will hereinafter be given mostly of the self-refresh mode, and the address controller 200 will thus selectively output the refresh address ref_add<0:n> in response to the enabled state of the self-refresh signal sref.

Figure 3A:
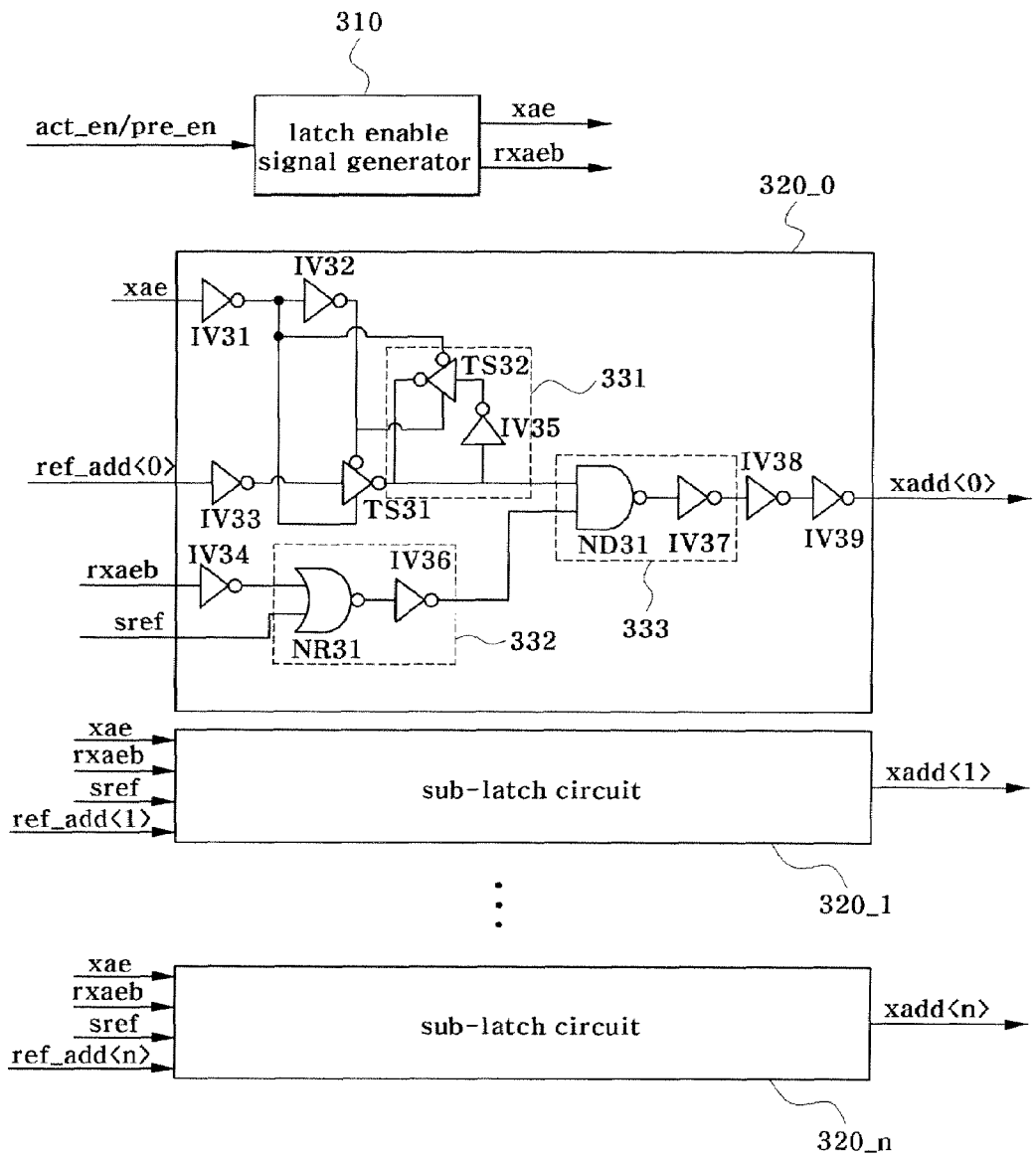
FIG. 3a is a circuit diagram of an address latch circuit in the semiconductor device according to this embodiment.

Then, the address latch circuit 300 latches the refresh address ref_add<0:n> in response to an active enable signal act_en for word line activation and a precharge enable signal pre_en which enables a precharge operation, to output the latched refresh address xadd<0:n>. The operation of the address latch circuit 300 will hereinafter be described in detail with reference to FIGS. 3a to 3c. As shown in FIG. 3a, the address latch circuit 300 includes a latch enable signal generator 310 and a plurality of sub-latch circuits 320_0, 320_1, . . . , 320_n.

The latch enable signal generator 310 receives the active enable signal act_en and precharge enable signal pre_en and outputs a latch enable signal xae and latch enable signal rxaeb, as will hereinafter be described in detail with reference to FIGS. 3b and 3c. In order to perform the self-refresh mode, the word line activation must first occur. For this reason, the active enable signal act_en is first enabled and the precharge enable signal pre_en is then enabled after each refresh mode is completed.

Figure 3B:
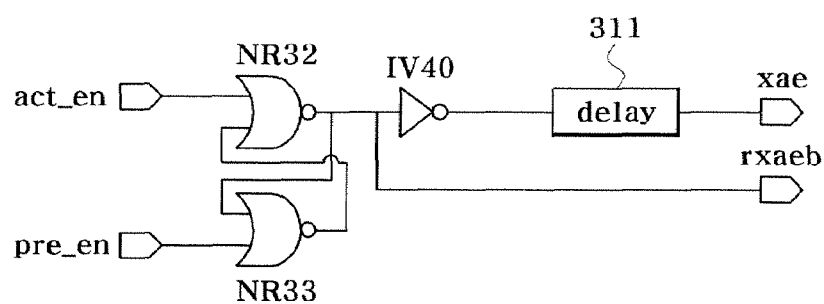
FIG. 3b is a circuit diagram of a latch enable signal generator in the address latch circuit.
Figure 3C:
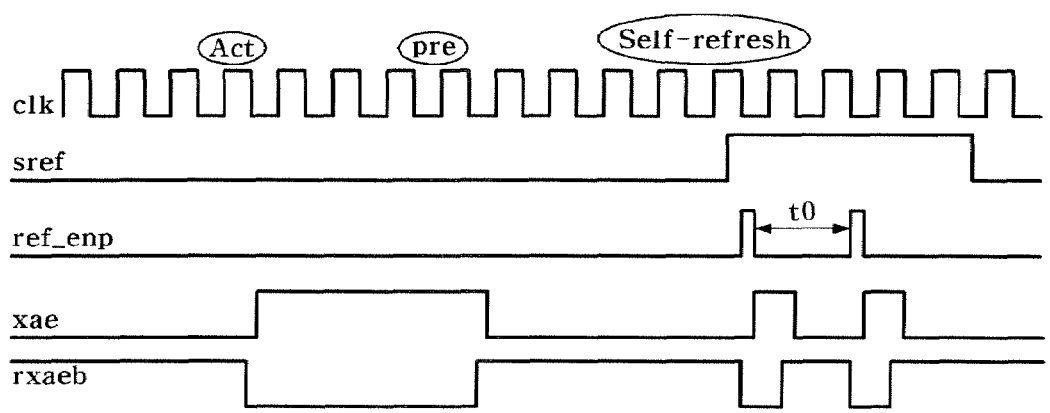
FIG. 3c is a timing diagram illustrating the operation of the latch enable signal generator.

Accordingly, as shown in FIG. 3c, when a refresh enable pulse ref_enp is enabled as the self-refresh mode is entered, the active enable signal act_en is enabled high in level. In this case, in FIG. 3b, a NOR gate NR32 outputs a low-level signal, thereby causing the latch enable signal rxaeb to first go from high to low in level and the latch enable signal xae to then go from low to high in level after the lapse of a delay time of a delay 311. As a result, in the sub-latch circuit 320_0 in FIG. 3a, a logic circuit 332 outputs a high-level signal, so that a refresh address bit value ref_add<0> latched by a latch 331 is outputted through a logic circuit 333. Further, as the latch enable signal xae becomes high in level, a tri-state buffer TS31 is turned off to block external input of address bit values other than the latched address bit value.

Thereafter, when the precharge enable signal pre_en is enabled high in level, a NOR gate NR33 in FIG. 3b outputs a low-level signal, and the NOR gate NR32 receives the active enable signal act_en, already changed to low in level, and the low-level signal from the NOR gate NR33 and outputs a high-level signal. As a result, the latch enable signal rxaeb first goes from low to high in level and the latch enable signal xae then goes from high to low in level after the lapse of the delay time of the delay 311. Consequently, in the sub-latch circuit 320_0 in FIG. 3a, as the latch enable signal xae becomes low in level, the tri-state buffer TS31 is turned on so that the next refresh address bit value ref_add<0> can be inputted from the address controller 200.

In this manner, the sub-latch circuit 320_0 latches the refresh address bit value ref_add<0> in response to the latch enable signal xae and latch enable signal rxaeb to output a latched refresh address bit value xadd<0>. In the same manner, the sub-latch circuits 320_1 to 320_n latch refresh address bit values ref_add<1:n> in response to the latch enable signal xae and latch enable signal rxaeb to output latched refresh address bit values xadd<1:n>, respectively.

Next, the fuse circuit 400 receives the latched refresh address xadd<0:n>, determines whether the received refresh address xadd<0:n> corresponds to a word line to be repaired (i.e., a failed word line to be replaced with a redundancy word line), and outputs the redundancy word line enable signal red_wl_en<0:N> and control signal red according to a result of the determination, as will hereinafter be described in detail with reference to FIGS. 4a and 4b.

Figure 4A:
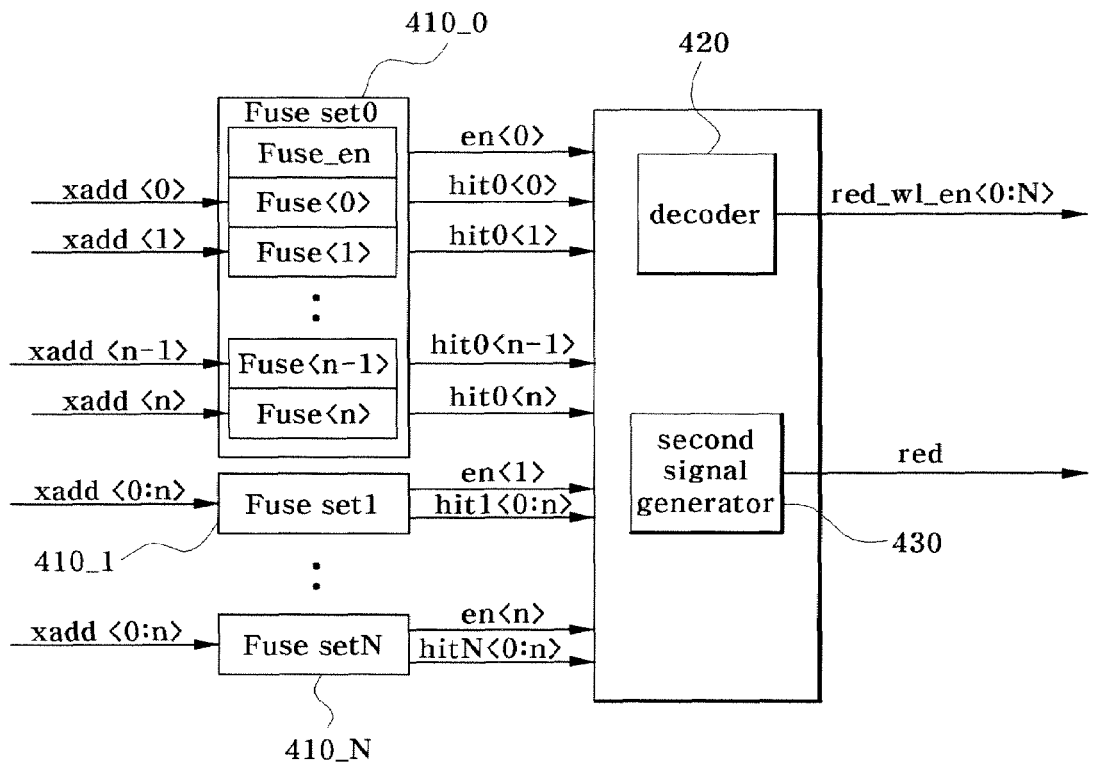
FIG. 4a is a block diagram of a fuse circuit in the semiconductor device according to this embodiment.
Figure 4B:
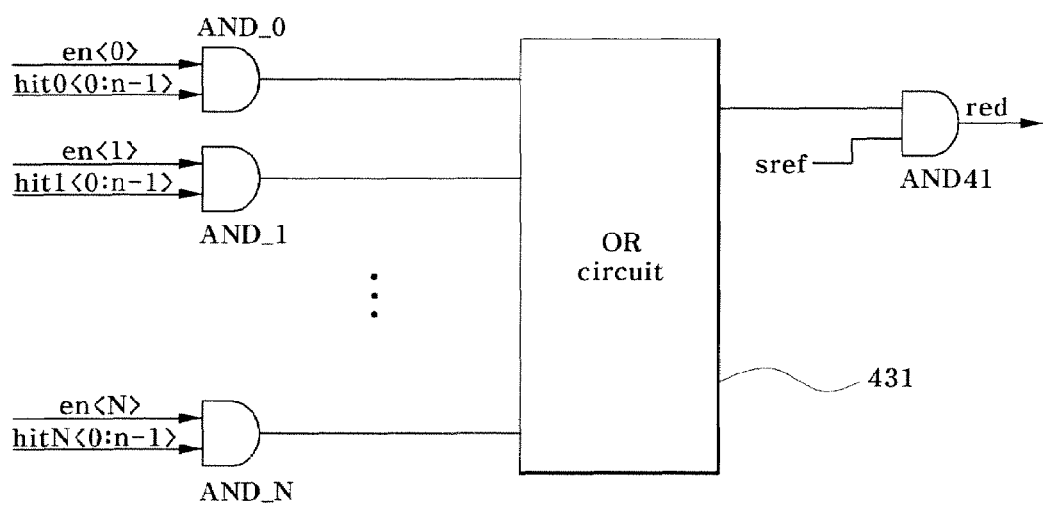
FIG. 4b is a circuit diagram of a second signal generator in the fuse circuit.

As shown in FIG. 4a, the latched refresh address xadd<0:n> is inputted to fuse sets 410_0 to 410_N. Each of the fuse sets 410_0 to 410_N includes a plurality of fuses whose cutting is determined depending on a word line to be repaired. Namely, the fuses have a combination corresponding to the address of a failed word line to be replaced with a redundancy word line. If each fuse set contains information regarding the address of a word line to be repaired, the fuse of a fuse signal generator Fuse_en therein is cut and an enable signal en thus assumes a high level. In the case where the refresh address xadd<0:n> corresponds to a word line to be repaired (i.e., a failed word line to be replaced with a redundancy word line), fuse signal generators Fuse<0> to Fuse<n> in each of the fuse sets 410_0 to 410_N output high-level fuse signals hit<0> to hit<n>, respectively. As a result, the fact that all the enable signal en and fuse signals hit<0> to hit<n> are high in level signifies that the refresh address xadd<0:n> corresponds to any one word line to be repaired.

In the case where the refresh address xadd<0:n> is determined to correspond to any one word line to be repaired, a decoder 420 receives the determination information, namely, the high-level enable signal en and high-level fuse signals hit<0> to hit<n>, and outputs the redundancy word line enable signal red_wl_en<0:N> to enable a redundancy word line designated to replace the word line to be repaired. The row controller 700 receives the redundancy word line enable signal red_wl_en<0:N> and performs the refresh operation with respect to a redundancy word line corresponding thereto, as will described later in detail. Here, the decoder 420 is the same in configuration and operation as decoders used in conventional fuse circuits.

On the other hand, in FIG. 4a, a second signal generator 430 receives the enable signal en and fuse signals hit<0> to hit<n−1> from each of the fuse sets 410_0 to 410_N, and enables and outputs the control signal red when all the enable signal en and fuse signals hit<0> to hit<n−1> from any one of the fuse sets 410_0 to 410_N are high in level. That is, as shown in FIG. 4b, if all the enable signal en<0> and fuse signals hit0<0> to hit0<n−1> from the fuse set 410_0 are high in level, an AND gate AND_0 outputs a high-level signal, and an OR circuit 431 performs an OR operation with respect to the high-level signal from the AND gate AND_0 and output signals from AND gates AND_1 to AND_N and outputs the resulting high-level signal. Because the current operation mode is the self-refresh mode, the self-refresh signal sref is high in level. As a result, the control signal red, outputted from an AND gate AND41, is enabled high in level. Consequently, the fact that the control signal red is enabled high in level signifies that the refresh address xadd<0:n> corresponds to any one word line to be repaired.

Next, the first signal generator 500 outputs the control signal double_en which defines the multi-word line refresh period, in response to the block selection bit value ref_add<n> of the refresh address ref_add<0:n> and the control signal red, as will hereinafter be described in detail with reference to FIGS. 5a and 5b. The block selection bit value ref_add<n> is a bit value for selection of a block in a corresponding bank. In the present embodiment, a most significant bit value of the refresh address ref_add<0:n> is used as the block selection bit value.

Figure 5A:
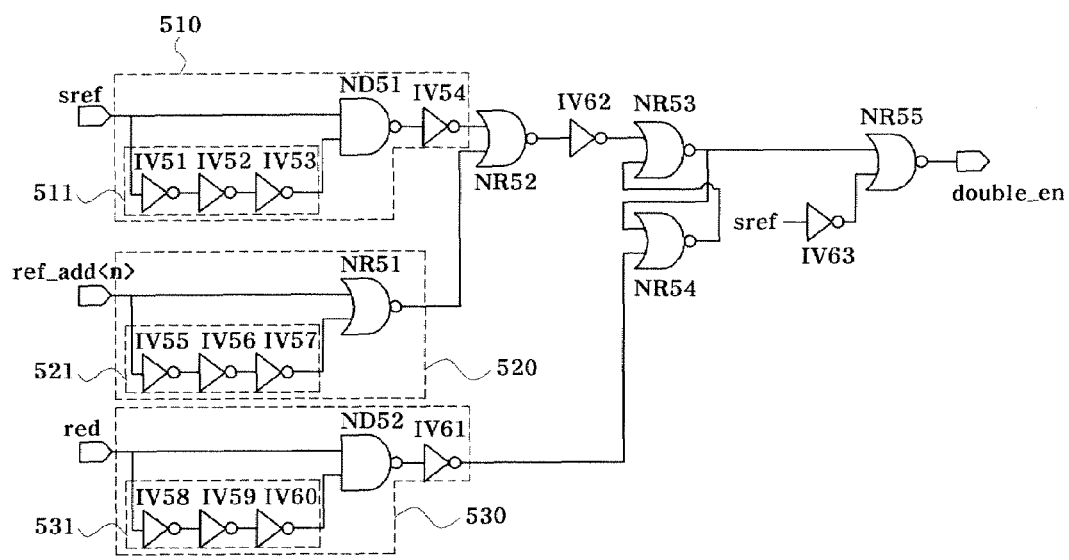
FIG. 5a is a circuit diagram of a first signal generator in the semiconductor device according to this embodiment.

In FIG. 5a, first, in a period before the self-refresh mode is entered, namely, in a period in which the self-refresh signal sref is low in level, a NOR gate NR55 outputs the control signal double_en of a low level irrespective of an output signal from a NOR gate NR53.

At the time that the self-refresh signal sref makes a low to high level transition as the self-refresh mode is entered, a delay 511 outputs a signal of a previous level, or high level, continuously for a predetermined delay time. As a result, a logic circuit composed of a NAND gate ND51 and inverter IV54 performs an AND operation with respect to the high-level self-refresh signal sref and the high-level signal from the delay 511 and outputs the resulting high-level signal. A logic circuit composed of a NOR gate NR52 and inverter IV62 receives the high-level signal from the logic circuit composed of the NAND gate ND51 and inverter IV54 and outputs a high-level signal, and the NOR gate NR53 receives this high-level signal and outputs a low-level signal. An inverter IV63 receives the high-level self-refresh signal sref and outputs a low-level signal. Consequently, the NOR gate NR55 receives the two low-level signals and outputs the control signal double_en of a high level. Meanwhile, at this time, because the control signal red is low in level, a signal processor 530 outputs a low-level signal. Thus, a NOR gate NR54 receives the two low-level signals and outputs a high-level signal. Thereafter, when the delay time has elapsed, the delay 511 outputs a low-level signal, thereby causing the output of the inverter IV54 to assume a low level. However, since the NOR gate NR53 receives the high-level signal from the NOR gate NR54 at its one input terminal, the control signal double_en remains high in level although the signal at the other input terminal of the NOR gate NR53 makes a level transition. Accordingly, the row controller 700 performs the refresh operation simultaneously with respect to two word lines for each bank in response to the control signal double_en, as will be described later in detail. Although the scheme for performing the refresh operation simultaneously with respect to two word lines for each bank has been described in the present embodiment, the present invention is not limited thereto. Any number of word lines may be simultaneously refreshed according to different embodiments as long as they are two or more.

At the time that the control signal red makes a low to high level transition as the refresh address xadd<0:n> corresponds to a word line to be repaired, a delay 531 outputs a signal of a previous level, or high level, continuously for the predetermined delay time. As a result, a logic circuit composed of a NAND gate ND52 and inverter IV61 performs an AND operation with respect to the high-level control signal red and the high-level signal from the delay 531 and outputs the resulting high-level signal. The NOR gate NR54 receives this high-level signal and outputs a low-level signal. At this time, because the output of the inverter IV62 is low in level, the NOR gate NR53 outputs a high-level signal, and the NOR gate NR55 receives the high-level signal from the NOR gate NR53 and outputs the control signal double_en of a low level. As a result, in response to the control signal double_en, the row controller 700 sequentially performs the refresh operation one by one with respect to word lines for each bank while the control signal double_en remains low in level, as will be described later in detail. Thereafter, when the delay time of the delay 531 has elapsed, the output of an inverter IV60 becomes low in level, thereby causing the output of the inverter IV61 to go low in level. At this time, however, a latch composed of the NOR gate NR53 and NOR gate NR54 holds the previous state irrespective of the output of the inverter IV61.

Figure 5B:
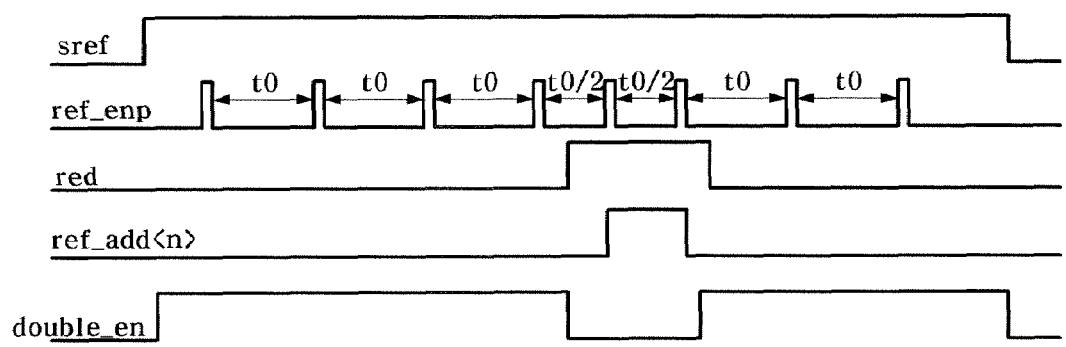
FIG. 5b is a timing diagram illustrating the operation of the first signal generator.

Thereafter, when the block selection bit value ref_add<n> makes a high to low level transition again after making a low to high level transition, as shown in FIG. 5b, a delay 521 outputs a signal of a previous level, or low level, continuously for the predetermined delay time. As a result, a NOR gate NR51 performs a NOR operation with respect to the low-level block selection bit value ref_add<n> and the low-level signal from the delay 521 and outputs the resulting high-level signal. The logic circuit composed of the NOR gate NR52 and inverter IV62 receives the high-level signal from the NOR gate NR51 and outputs a high-level signal, and the NOR gate NR53 receives this high-level signal and outputs a low-level signal. Consequently, the NOR gate NR55 receives the two low-level signals and outputs the control signal double_en of a high level. Subsequently, when the delay time has elapsed, the delay 521 outputs a high-level signal, thereby causing the output of the NOR gate NR51 to assume a low level. However, since the latch composed of the NOR gate NR53 and NOR gate NR54 holds the previous state irrespective of the output of the NOR gate NR51 and thus outputs the low-level signal continuously, the control signal double_en remains high in level. Accordingly, the row controller 700 again performs the refresh operation simultaneously with respect to two word lines for each bank in response to the control signal double_en, as will be described later in detail.

Thereafter, at the time that the self-refresh signal sref makes a high to low level transition as the self-refresh mode is completed, the control signal double_en from the NOR gate NR55 is disabled low in level.

Next, the refresh address generator 600 generates the refresh address ref_add<0:n> in response to the control signal double_en, as will hereinafter be described in detail with reference to FIGS. 6a to 6e.

Figure 6A:
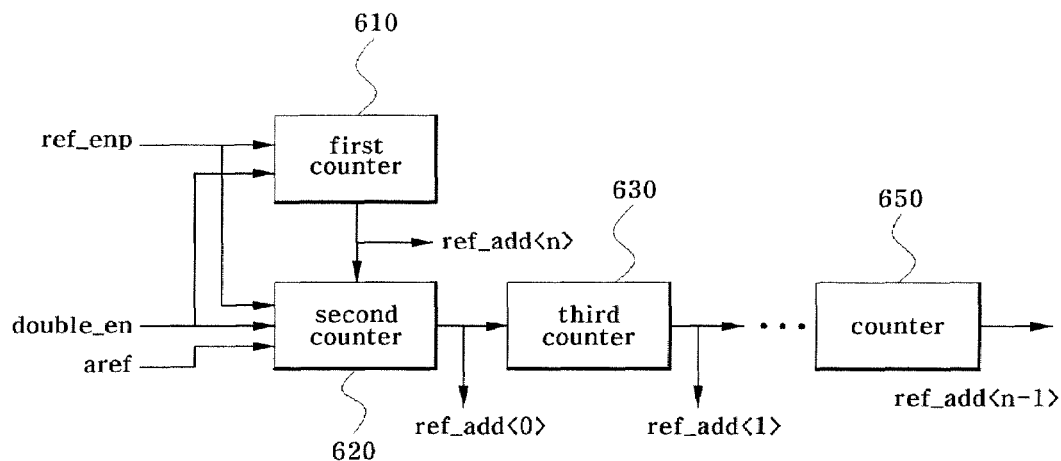
FIG. 6a is a block diagram of a refresh address generator in the semiconductor device according to this embodiment.
Figure 6B:
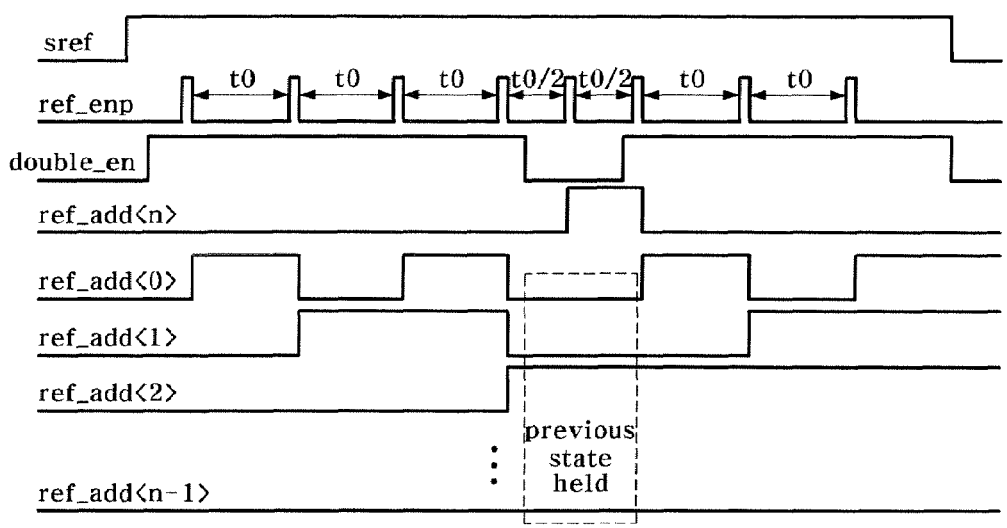
FIG. 6b is a timing diagram illustrating the operation of the refresh address generator.

As shown in FIG. 6a, a first counter 610 receives the refresh enable pulse ref_enp, which is enabled at a certain period t0, and the control signal double_en, and counts the refresh enable pulse ref_enp in response to the disabled state of the control signal double_en to output the block selection bit value ref_add<n> which is the most significant bit value of the refresh address ref_add<0:n>. That is, first, in a period in which the control signal double_en is high in level as shown in FIG. 6b, in FIG. 6c, an NMOS transistor N61 is turned on to hold the input of a tri-state buffer TS61 at a low level. At this time, a logic circuit 611 outputs a low-level signal, thereby causing the tri-state buffer TS61 to be turned on. Accordingly, as shown in FIG. 6b, in the period in which the control signal double_en is high in level, the block selection bit value ref_add<n> assumes a low level.

Figure 6C:
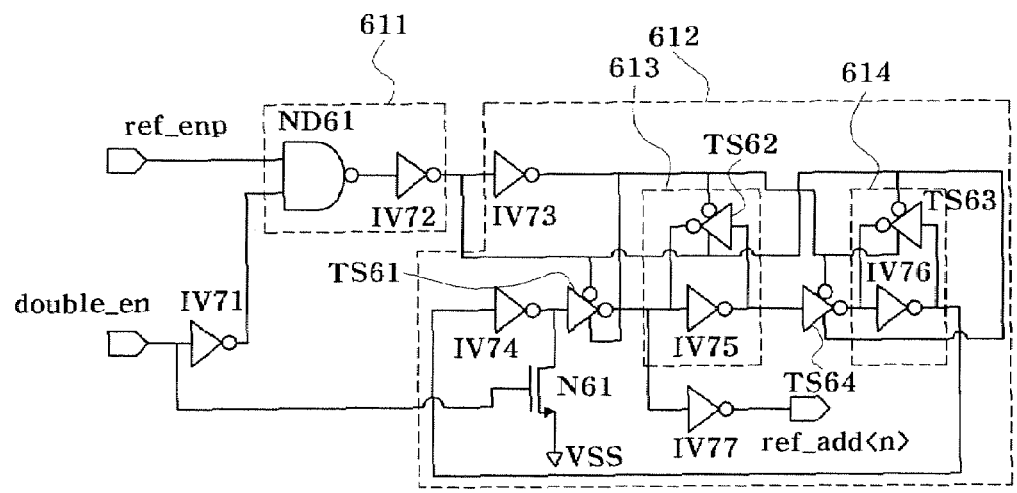
FIG. 6c is a circuit diagram of a first counter in the refresh address generator.

On the other hand, at the time that the control signal double_en makes a high to low level transition, in FIG. 6c, the NMOS transistor N61 is turned off, whereas the output of an inverter IV71 goes high in level, so that the logic circuit 611 receives the refresh enable pulse ref_enp. In a period in which the refresh enable pulse ref_enp assumes a low level after the control signal double_en goes low in level, as shown in FIG. 6b, the tri-state buffer TS61 and a tri-state buffer TS63 are turned on and a tri-state buffer TS62 and tri-state buffer TS64 are turned off. As a result, a latch 614 holds the previous state, thereby causing the block selection bit value ref_add<n> to remain low in level. Subsequently, at the time that the refresh enable pulse ref_enp makes a low to high level transition, the tri-state buffer TS61 and tri-state buffer TS63 are turned off and the tri-state buffer TS62 and tri-state buffer TS64 are turned on.

As a result, the tri-state buffer TS64 outputs a high-level signal and the output of an inverter IV74 becomes high in level. At the time that the refresh enable pulse ref_enp again goes low in level, the tri-state buffer TS61 and tri-state buffer TS63 are turned on and the tri-state buffer TS62 and tri-state buffer TS64 are turned off. Hence, the tri-state buffer TS61 outputs a low-level signal and the block selection bit value ref_add<n> thus goes from low to high in level.

In this manner, a counting circuit 612 makes the level transition of the block selection bit value ref_add<n> by detecting the falling edge of the refresh enable pulse ref_enp. Therefore, the block selection bit value ref_add<n> again goes low in level at the next falling edge of the refresh enable pulse ref_enp, as shown in FIG. 6b. Thereafter, when the control signal double_en again goes high in level, the block selection bit value ref_add<n> remains low in level. Consequently, if the control signal double_en makes a high to low level transition in a certain period as the refresh address xadd<0:n> corresponds to a word line to be repaired, the block selection bit value ref_add<n> has a duration of '0' and a duration of '1' in that period.

On the other hand, as shown in FIG. 6a, a second counter 620 receives the refresh enable pulse ref_enp, control signal double_en and block selection bit value ref_add<n>, and generates the refresh address bit value ref_add<0> by counting the refresh enable pulse ref_enp when the control signal double_en is in its enabled state and by counting the block selection bit value ref_add<n> when the control signal double_en is in its disabled state. That is, first, in a period in which the control signal double_en is enabled high in level as shown in FIG. 6b, in FIG. 6d, a transfer gate T61 is turned on and a transfer gate T62 is turned off, so that the refresh enable pulse ref_enp is transferred through the transfer gate T61. The circuit configuration at the right-hand side of the transfer gate T61 is the same as that of the counting circuit 612 of the first counter 610, with the exception of the NMOS transistor N61. As a result, in the period in which the control signal double_en is high in level, the refresh address bit value ref_add<0>, which is the output signal from the second counter 620, makes a level transition synchronously with the falling edge of the refresh enable pulse ref_enp, as shown in FIG. 6b.

Figure 6D:
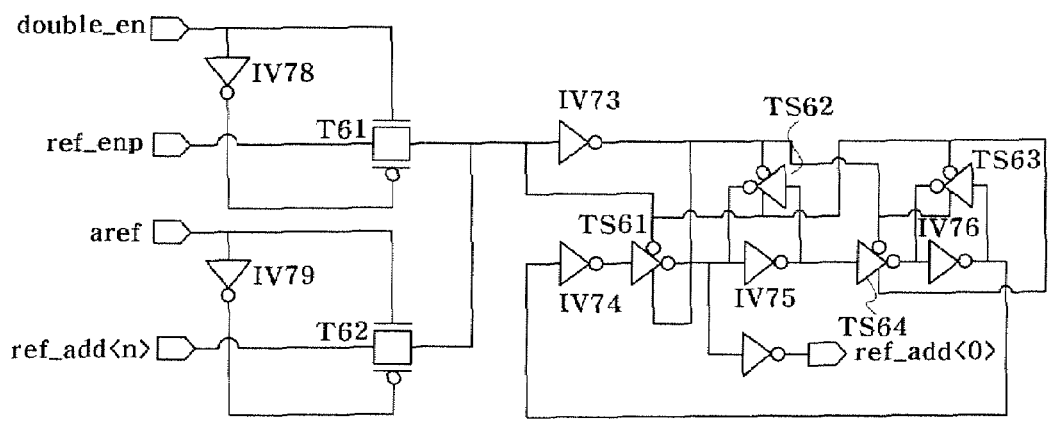
FIG. 6d is a circuit diagram of a second counter in the refresh address generator.

Thereafter, at the time that the control signal double_en goes low in level as shown in FIG. 6b, in FIG. 6d, the transfer gate T61 is turned off and the transfer gate T62 is turned on, so that the block selection bit value ref_add<n> is transferred through the transfer gate T62. As a result, in a period in which the control signal double_en is low in level, the refresh address bit value ref_add<0>, which is the output signal from the second counter 620, makes a level transition synchronously with the falling edge of the block selection bit value ref_add<n>, as shown in FIG. 6b. Subsequently, when the control signal double_en is again enabled high in level, the refresh address bit value ref_add<0>, which is the output signal from the second counter 620, again makes a level transition synchronously with the falling edge of the refresh enable pulse ref_enp, as shown in FIG. 6b.

Figure 6E:
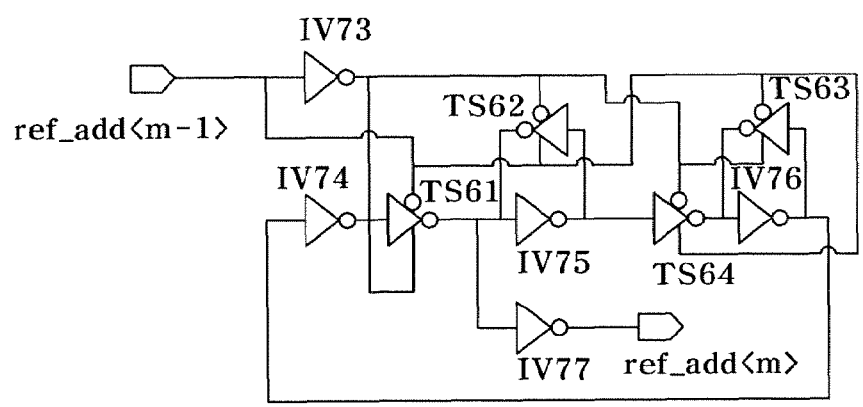
FIG. 6e is a circuit diagram of a third counter in the refresh address generator.
Figure 7:
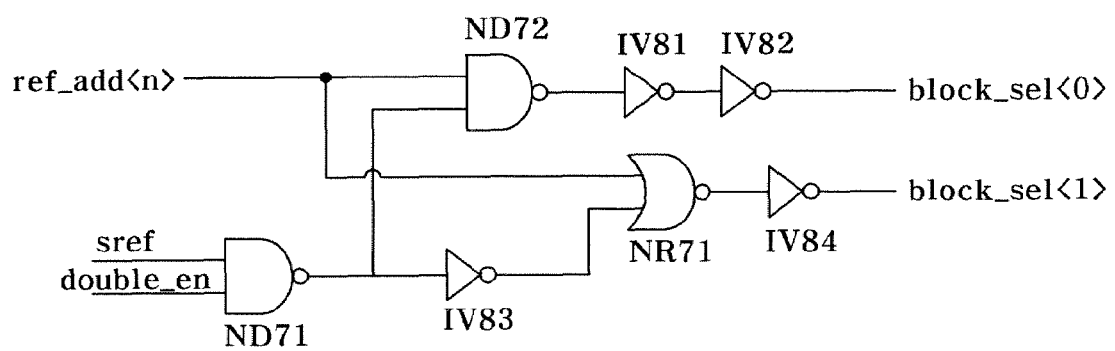
FIG. 7 is a circuit diagram of a block selector in a row controller in the semiconductor device according to this embodiment.

A third counter 630 counts the refresh address bit value ref_add<0> to output the refresh address bit value ref_add<1>. As shown in FIG. 6e, the third counter 630 is the same in configuration as the counting circuit 612 of the first counter 610, with the exception of the NMOS transistor N61. As a result, the refresh address bit value ref_add<1> makes a level transition synchronously with the falling edge of the refresh address bit value ref_add<0>, as shown in FIG. 6b. A plurality of counters 650 connected in series to the output of the third counter 630 are the same in configuration as the third counter 630 and thus function to count refresh address bit values inputted respectively thereto to output the corresponding refresh address bit values ref_add<2:n–1>, respectively.

In this manner, the refresh address generator 600 generates the refresh address ref_add<0:n> in response to the control signal double_en. In the period in which the control signal double_en is high in level, the refresh address generator 600 holds the block selection bit value ref_add<n> at a low level at the same time as generating the refresh address bit values ref_add<0:n–1>, such that the dual word line refreshing is performed with respect to word lines included in a plurality of memory blocks of each memory bank. In the period in which the control signal double_en is low in level, the refresh address generator 600 generates the block selection bit value ref_add<n> such that the refresh operation is performed sequentially one by one with respect to word lines of the respective memory blocks. In the present embodiment, in the period in which the control signal double_en is low in level, the period of the refresh enable pulse ref_enp is reduced to ½ the low-level period t0 of the control signal double_en, namely, t0/2, so that the single word line refreshing can be performed more rapidly than the multi-word line refreshing.

Finally, the row controller 700 receives the refresh address xadd<0:n>, control signal double_en and redundancy word line enable signal red_wl_en<0:N> and controls the refresh operation with respect to the memory core 800. The basic configuration of the row controller 700 adapted to receive the redundancy word line enable signal red_wl_en<0:N> and perform the refresh operation with respect to a redundancy word line is the same as that in a conventional multi-word line refresh-type semiconductor device. In the present embodiment, the row controller 700 includes a block selector shown in FIG. 7 and the operation thereof will hereinafter be described in detail with reference to FIG. 7.

First, in the case where the self-refresh mode is performed with respect to a normal word line, the self-refresh signal sref and the control signal double_en become high in level. As a result, a NAND gate ND71 outputs a low-level signal, thereby causing a block select signal block_sel<0> from a NAND gate ND72 and a block select signal block_sel<1> from an inverter IV84 to become high in level. Here, the block select signal block_sel<0> and the block select signal block_sel<1> are used to select blocks in each bank for which the refresh operation is to be performed. In the present embodiment, the block select signal block_sel<0> and the block select signal block_sel<1> are used to select an upper block and a lower block in each bank, respectively. In this case, because both the block select signal block_sel<0> and block select signal block_sel<1> are enabled high in level, the refresh operation is performed simultaneously with respect to two word lines for each bank.

Meanwhile, when the control signal double_en goes low in level as the refresh address xadd<0:n> corresponds to a word line to be repaired, the NAND gate ND71 outputs a high-level signal. At this time, in a period in which the block selection bit value ref_add<n> is low in level, the NAND gate ND72 outputs a high-level signal, so that only the block select signal block_sel<0> is enabled high in level. Accordingly, in this case, the refresh operation is performed with respect to only one word line in the upper block in each bank. On the other hand, in a period in which the block selection bit value ref_add<n> is high in level, a logic circuit composed of a NOR gate NR71 and the inverter IV84 outputs the block select signal block_sel<1> of a high level.

As a result, in this case, because only the block select signal block_sel<1> becomes high in level, the refresh operation is performed with respect to only one word line in the lower block in each bank. Thereafter, when the control signal double_en again becomes high in level, the semiconductor device performs the refresh operation simultaneously with respect to two word lines for each bank.

As described above, the semiconductor device according to the present embodiment performs, in the self-refresh mode, the multi-word line refreshing when the refresh address corresponds to a normal word line and the single word line refreshing for a certain period when the refresh address corresponds to a word line to be repaired. Therefore, according to the present embodiment, a plurality of redundancy word lines do not need to be exclusively used correspondingly to only specific memory blocks in each memory bank. In other words, the plurality of redundancy word lines can be used to replace failed word lines in any memory blocks in each bank. Consequently, it is possible to reduce a chip area occupied by the plurality of redundancy word lines, thereby securing economic efficiency of chip design.

Although the scheme for performing the refresh operation simultaneously with respect to two word lines for each bank has been described in the present embodiment, the present invention is not limited thereto. Any number of word lines may be simultaneously refreshed according to different embodiments as long as they are two or more. Notably, even in this case, when the refresh address corresponds to any one word line to be repaired, the multi-word line refreshing is stopped with respect to a plurality of word lines and the single word line refreshing is sequentially performed with respect to the plurality of word lines.

As apparent from the above description, the present invention provides a multi-word line refresh-type semiconductor device for performing, in a self-refresh mode, multi-word line refreshing when a refresh address corresponds to a normal word line and single word line refreshing for a certain period when the refresh address corresponds to a word line to be repaired, so that a plurality of redundancy word lines in each memory bank can be used to replace failed word lines in any memory blocks in each bank, thereby reducing a chip area occupied by the redundancy word lines and thus securing economic efficiency of chip design.

Although various embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. the semiconductor device comprising:
   an address controller for receiving a normal address and a refresh address and selectively outputting the received refresh address in a refresh mode;
   a fuse circuit for receiving the refresh address, determining whether the received refresh address corresponds to a word line to be repaired and outputting a redundancy word line enable signal and a first control signal according to a result of the determination;
   a first signal generator for, in response to a bit value for block selection of the refresh address and the first control signal, outputting a second control signal which defines a multi-word line refresh period;
   a refresh address generator for generating the refresh address in response to the second control signal; and
   a row controller for receiving the refresh address, second control signal and redundancy word line enable signal and controlling the refresh operation with respect to a memory core,
   wherein the semiconductor device performs, in the self-refresh mode, multi-word line refreshing when the refresh address corresponds to a normal word line and single word line refreshing for a certain period when the refresh address corresponds to the word line to be repaired.

2. The semiconductor device as set forth in claim 1, wherein the fuse circuit comprises:
   a plurality of fuse sets, each of the fuse sets including a plurality of fuses whose cutting is determined depending on the word line to be repaired, and acting to output a plurality of determination signals in response to the refresh address;
   a decoder for decoding the determination signals to output the redundancy word line enable signal; and
   a second signal generator for outputting the first control signal in response to the determination signals.

3. The semiconductor device as set forth in claim 2, wherein the second signal generator enables the first control signal when all the determination signals from at least one of the fuse sets are enabled in the self-refresh mode.

4. The semiconductor device as set forth in claim 3, wherein the second signal generator comprises:
   a plurality of first logic devices, each of the first logic devices performing an AND operation with respect to the determination signals from a corresponding one of the fuse sets;
   a second logic device for performing an OR operation with respect to output signals from the first logic devices; and
   a third logic device for performing the AND operation with respect to an output signal from the second logic device and a self-refresh signal.

5. The semiconductor device as set forth in claim 1, wherein the first signal generator comprises:
   a first signal processor for outputting a first signal which is enabled for a predetermined period, in response to an enabled state of a self-refresh signal;
   a second signal processor for outputting a second signal which is enabled for the predetermined period, in response to a disabled state of the block selection bit value;
   a third signal processor for outputting a third signal which is enabled for the predetermined period, in response to an enabled state of the first control signal;
   a first logic circuit for performing a logic operation with respect to the first signal from the first signal processor and the second signal from the second signal processor; and
   a latch for latching an output signal from the first logic circuit and the third signal from the third signal processor.

6. The semiconductor device as set forth in claim 5, wherein the first signal processor comprises:
   a delay for delaying and inverting the self-refresh signal by the predetermined period; and
   a second logic circuit for performing a logic operation with respect to the self-refresh signal and an output signal from the delay.

7. The semiconductor device as set forth in claim 6, wherein the second logic circuit performs an AND operation.

8. The semiconductor device as set forth in claim 5, wherein the second signal processor comprises:
- a delay for delaying and inverting the block selection bit value by the predetermined period; and
- a second logic circuit for performing a logic operation with respect to the block selection bit value and an output signal from the delay.

9. The semiconductor device as set forth in claim 8, wherein the second logic circuit performs a NOR operation.

10. The semiconductor device as set forth in claim 5, wherein the third signal processor comprises:
- a delay for delaying and inverting the first control signal by the predetermined period; and
- a second logic circuit for performing a logic operation with respect to the first control signal and an output signal from the delay.

11. The semiconductor device as set forth in claim 10, wherein the second logic circuit performs an AND operation.

12. The semiconductor device as set forth in claim 5, wherein the latch comprises:
- a first logic gate for receiving the output signal from the first logic circuit at its one input terminal; and
- a second logic gate for receiving the third signal from the third signal processor at its one input terminal,
- wherein the first logic gate and the second logic gate are interconnected in latch form.

13. The semiconductor device as set forth in claim 12, wherein each of the first logic gate and second logic gate performs a NOR operation.

14. The semiconductor device as set forth in claim 5, wherein the first signal generator further comprises a second logic circuit for performing a logic operation with respect to a buffered version of the self-refresh signal and an output signal from the latch.

15. The semiconductor device as set forth in claim 14, wherein the second logic circuit performs a NOR operation.

16. The semiconductor device as set forth in claim 1, wherein the refresh address generator comprises:
- a first counter for receiving a refresh enable pulse which is enabled at a certain period and the second control signal and counting the refresh enable pulse in response to a disabled state of the second control signal to output the block selection bit value;
- a second counter for receiving the refresh enable pulse, second control signal and block selection bit value and outputting a first bit value of the refresh address in response to the second control signal; and
- a third counter for counting the first refresh address bit value to output a second bit value of the refresh address.

17. The semiconductor device as set forth in claim 16, wherein the first counter comprises:
- a first buffer for buffering the second control signal;
- a logic circuit for performing a logic operation with respect to an output signal from the first buffer and the refresh enable pulse;
- a counting circuit for counting an output signal from the logic circuit to output the block selection bit value; and
- enabling means for enabling the counting circuit in response to the second control signal.

18. The semiconductor device as set forth in claim 17, wherein the first buffer is an inverter.

19. The semiconductor device as set forth in claim 17, wherein the logic circuit performs an AND operation.

20. The semiconductor device as set forth in claim 17, wherein the enabling means comprises voltage holding means for holding a voltage at a specific node of the counting circuit in response to the second control signal.

21. The semiconductor device as set forth in claim 20, wherein the counting circuit comprises:
- a second buffer for buffering the output signal from the logic circuit;
- a first tri-state buffer for buffering a signal at the specific node in response to the output signal from the logic circuit;
- a first latch for latching an output signal from the first tri-state buffer in response to the output signal from the logic circuit;
- a second tri-state buffer for buffering an output signal from the first latch in response to the output signal from the logic circuit;
- a second latch for latching an output signal from the second tri-state buffer in response to the output signal from the logic circuit;
- a third buffer for buffering an output signal from the second latch; and
- a fourth buffer for buffering the output signal from the first tri-state buffer to output the block selection bit value.

22. The semiconductor device as set forth in claim 16, wherein the second counter generates the first refresh address bit value by counting the refresh enable pulse when the second control signal is in its enabled state and by counting the block selection bit value when the second control signal is in its disabled state.

23. The semiconductor device as set forth in claim 22, wherein the second counter comprises:
- a first transfer gate for transferring the refresh enable pulse to a specific node in response to the second control signal;
- a second transfer gate for transferring the block selection bit value to the specific node in response to the second control signal; and
- a counting circuit for counting a signal at the specific node to output the first refresh address bit value.

24. The semiconductor device as set forth in claim 1, wherein the row controller simultaneously enables a first block select signal and a second block select signal when a self-refresh signal and the second control signal are enabled, and selectively enables any one of the first block select signal and second block select signal in response to the block selection bit value when the second control signal is disabled.

25. The semiconductor device as set forth in claim 24, wherein the row controller comprises a block selector, the block selector including:
- a first logic circuit for performing a logic operation with respect to the self-refresh signal and the second control signal;
- a second logic circuit for performing a logic operation with respect to an output signal from the first logic circuit and the block selection bit value;
- a buffer for buffering the output signal from the first logic circuit; and
- a third logic circuit for performing a logic operation with respect to an output signal from the buffer and the block selection bit value.

26. The semiconductor device as set forth in claim 25, wherein each of the first logic circuit and second logic circuit performs a NAND operation and the third logic circuit performs an OR operation.

27. The semiconductor device as set forth in claim 1, further comprising an address latch circuit for latching the refresh address outputted from the address controller and providing the latched refresh address to the fuse circuit and row controller.

28. The semiconductor device as set forth in claim 27, wherein the address latch circuit comprises:
a latch enable signal generator for generating a first latch enable signal and a second latch enable signal in response to a first active signal and a second active signal; and
a plurality of sub-latch circuits for latching the refresh address in response to the first and second latch enable signals.

29. The semiconductor device as set forth in claim 28, wherein the latch enable signal generator comprises:
a latch for latching the first active signal and the second active signal;
a buffer for buffering an output signal from the latch; and
a delay for delaying an output signal from the buffer and outputting the delayed signal as the first latch enable signal.

30. The semiconductor device as set forth in claim 29, wherein the latch comprises:
a first NOR gate for receiving the first active signal at its one input terminal; and
a second NOR gate for receiving the second active signal at its one input terminal,
wherein the first NOR gate and the second NOR gate are interconnected in latch form.

31. The semiconductor device as set forth in claim 28, wherein each of the sub-latch circuits comprises:
a first buffer for buffering the second latch enable signal;
a first logic circuit for performing a logic operation with respect to an output signal from the first buffer and a self-refresh signal;
a tri-state buffer for buffering a corresponding bit value of the refresh address in response to the first latch enable signal;
a latch for latching an output signal from the tri-state buffer in response to the first latch enable signal; and
a second logic circuit for performing a logic operation with respect to the output signal from the tri-state buffer and an output signal from the first logic circuit.

32. The semiconductor device as set forth in claim 31, wherein the first logic circuit performs an OR operation and the second logic circuit performs an AND operation.

33. The semiconductor device as set forth in claim 28, wherein the first active signal is an active enable signal and the second active signal is a precharge enable signal.

34. The semiconductor device as set forth in claim 1, wherein the block selection bit value is a most significant bit value of the refresh address.

35. A semiconductor device having a plurality of memory banks, each of the memory banks including a plurality of redundancy word lines to replace failed word lines, and a plurality of memory blocks, wherein, in a self-refresh mode, a refresh operation is performed simultaneously with respect to a plurality of word lines for each of the memory banks when a refresh address corresponds to a normal word line, and sequentially one by one with respect to word lines for each of the memory banks for a certain period when the refresh address corresponds to a word line to be repaired,
wherein the memory blocks included in each of the memory banks share the plurality of redundancy word lines with one another.

36. The semiconductor device as set forth in claim 35, wherein:
when the refresh operation is performed simultaneously with respect to the plurality of word lines for each of the memory banks, at least one of word lines in each of the memory blocks is selected and the refresh operation is performed simultaneously with respect to the selected word lines in the memory blocks; and
when the refresh operation is performed sequentially one by one with respect to the word lines for each of the memory banks, the refresh operation is performed sequentially with respect to the memory blocks in such a manner that at least one of the word lines in each of the memory blocks is selected and the refresh operation is performed sequentially with respect to the selected word lines in the memory blocks.

37. The semiconductor device as set forth in claim 35, comprising:
a fuse circuit for receiving the refresh address, determining whether the received refresh address corresponds to the word line to be repaired and outputting a first control signal according to a result of the determination;
a first signal generator for, in response to a bit value for block selection of the refresh address and the first control signal, outputting a second control signal which defines a multi-word line refresh period;
a refresh address generator for generating the refresh address in response to the second control signal; and
a row controller for receiving the refresh address and second control signal and controlling the refresh operation with respect to a memory core.

38. The semiconductor device as set forth in claim 37, further comprising:
an address controller for receiving a normal address and the refresh address and selectively outputting the received refresh address in a refresh mode; and
an address latch circuit for latching the refresh address outputted from the address controller and providing the latched refresh address to the fuse circuit and row controller.

39. The semiconductor device as set forth in claim 38, wherein the address latch circuit comprises:
a latch enable signal generator for generating a first latch enable signal and a second latch enable signal in response to a first active signal and a second active signal; and
a plurality of sub-latch circuits for latching the refresh address in response to the first and second latch enable signals.

40. The semiconductor device as set forth in claim 39, wherein the latch enable signal generator comprises:
a latch for latching the first active signal and the second active signal;
a buffer for buffering an output signal from the latch; and
a delay for delaying an output signal from the buffer and outputting the delayed signal as the first latch enable signal,
wherein the latch includes:
a first NOR gate for receiving the first active signal at its one input terminal; and
a second NOR gate for receiving the second active signal at its one input terminal,
wherein the first NOR gate and the second NOR gate are interconnected in latch form.

41. The semiconductor device as set forth in claim 39, wherein each of the sub-latch circuits comprises:

a first buffer for buffering the second latch enable signal;
a first logic circuit for performing a logic operation with respect to an output signal from the first buffer and a self-refresh signal;
a tri-state buffer for buffering a corresponding bit value of the refresh address in response to the first latch enable signal;
a latch for latching an output signal from the tri-state buffer in response to the first latch enable signal; and
a second logic circuit for performing a logic operation with respect to the output signal from the tri-state buffer and an output signal from the first logic circuit.

42. The semiconductor device as set forth in claim 37, wherein the fuse circuit comprises:
a plurality of fuse sets, each of the fuse sets including a plurality of fuses whose cutting is determined depending on the word line to be repaired, and acting to output a plurality of determination signals in response to the refresh address;
a decoder for decoding the determination signals to output a redundancy word line enable signal; and
a second signal generator for outputting the first control signal in response to the determination signals.

43. The semiconductor device as set forth in claim 42, wherein the second signal generator enables the first control signal when all the determination signals from at least one of the fuse sets are enabled in the self-refresh mode.

44. The semiconductor device as set forth in claim 43, wherein the second signal generator comprises:
a plurality of first logic devices, each of the first logic devices performing an AND operation with respect to the determination signals from a corresponding one of the fuse sets;
a second logic device for performing an OR operation with respect to output signals from the first logic devices; and
a third logic device for performing the AND operation with respect to an output signal from the second logic device and a self-refresh signal.

45. The semiconductor device as set forth in claim 37, wherein the first signal generator comprises:
a first signal processor for outputting a first signal which is enabled for a predetermined period, in response to an enabled state of a self-refresh signal;
a second signal processor for outputting a second signal which is enabled for the predetermined period, in response to a disabled state of the block selection bit value;
a third signal processor for outputting a third signal which is enabled for the predetermined period, in response to an enabled state of the first control signal;
a first logic circuit for performing a logic operation with respect to the first signal from the first signal processor and the second signal from the second signal processor; and
a latch for latching an output signal from the first logic circuit and the third signal from the third signal processor.

46. The semiconductor device as set forth in claim 45, wherein the first signal processor comprises:
a delay for delaying and inverting the self-refresh signal by the predetermined period; and
a second logic circuit for performing a logic operation with respect to the self-refresh signal and an output signal from the delay.

47. The semiconductor device as set forth in claim 45, wherein the second signal processor comprises:
a delay for delaying and inverting the block selection bit value by the predetermined period; and
a second logic circuit for performing a logic operation with respect to the block selection bit value and an output signal from the delay.

48. The semiconductor device as set forth in claim 45, wherein the third signal processor comprises:
a delay for delaying and inverting the first control signal by the predetermined period; and
a second logic circuit for performing a logic operation with respect to the first control signal and an output signal from the delay.

49. The semiconductor device as set forth in claim 45, wherein the latch comprises:
a first logic gate for receiving the output signal from the first logic circuit at its one input terminal; and
a second logic gate for receiving the third signal from the third signal processor at its one input terminal,
wherein the first logic gate and the second logic gate are interconnected in latch form, each of the first logic gate and second logic gate performing a NOR operation.

50. The semiconductor device as set forth in claim 45, wherein the first signal generator further comprises a second logic circuit for performing a logic operation with respect to a buffered version of the self-refresh signal and an output signal from the latch.

51. The semiconductor device as set forth in claim 37, wherein the refresh address generator comprises:
a first counter for receiving a refresh enable pulse which is enabled at a certain period and the second control signal and counting the refresh enable pulse in response to a disabled state of the second control signal to output the block selection bit value;
a second counter for receiving the refresh enable pulse, second control signal and block selection bit value and outputting a first bit value of the refresh address in response to the second control signal; and
a third counter for counting the first refresh address bit value to output a second bit value of the refresh address.

52. The semiconductor device as set forth in claim 51, wherein the first counter comprises:
a first buffer for buffering the second control signal;
a logic circuit for performing a logic operation with respect to an output signal from the first buffer and the refresh enable pulse;
a counting circuit for counting an output signal from the logic circuit to output the block selection bit value; and
enabling means for enabling the counting circuit in response to the second control signal.

53. The semiconductor device as set forth in claim 52, wherein the logic circuit performs an AND operation.

54. The semiconductor device as set forth in claim 52, wherein the enabling means comprises voltage holding means for holding a voltage at a specific node of the counting circuit in response to the second control signal.

55. The semiconductor device as set forth in claim 51, wherein the second counter generates the first refresh address bit value by counting the refresh enable pulse when the second control signal is in its enabled state and by counting the block selection bit value when the second control signal is in its disabled state.

56. The semiconductor device as set forth in claim 55, wherein the second counter comprises:
a first transfer gate for transferring the refresh enable pulse to a specific node in response to the second control signal;

a second transfer gate for transferring the block selection bit value to the specific node in response to the second control signal; and a counting circuit for counting a signal at the specific node to output the first refresh address bit value.

57. The semiconductor device as set forth in claim 37, wherein the row controller simultaneously enables a first block select signal and a second block select signal when a self-refresh signal and the second control signal are enabled, and selectively enables any one of the first block select signal and second block select signal in response to the block selection bit value when the second control signal is disabled.

58. The semiconductor device as set forth in claim 57, wherein the row controller comprises a block selector, the block selector including:

a first logic circuit for performing a logic operation with respect to the self-refresh signal and the second control signal;

a second logic circuit for performing a logic operation with respect to an output signal from the first logic circuit and the block selection bit value;

a buffer for buffering the output signal from the first logic circuit; and a third logic circuit for performing a logic operation with respect to an output signal from the buffer and the block selection bit value.

59. The semiconductor device as set forth in claim 58, wherein each of the first logic circuit and second logic circuit performs a NAND operation and the third logic circuit performs an OR operation.

60. The semiconductor device as set forth in claim 37, wherein the block selection bit value is a most significant bit value of the refresh address.

61. The semiconductor device as set forth in claim 1, wherein the semiconductor device is a multi-word line refresh-type semiconductor device which has a plurality of memory banks and performs a refresh operation simultaneously with respect to a plurality of word lines for each of the banks in a self-refresh mode.

* * * * *